United States Patent
Bauer

(10) Patent No.: US 6,729,889 B2
(45) Date of Patent: May 4, 2004

(54) ELECTRICAL CONNECTION ARRANGEMENT AND METHOD FOR THE MANUFACTURE THEREOF

(75) Inventor: Gunter Bauer, Sulzbach-Rosenberg (DE)

(73) Assignee: Cherry GmbH, Auerbach/Opf. (DE)

( * ) Notice: Subject to any disclaimer, the term of this patent is extended or adjusted under 35 U.S.C. 154(b) by 0 days.

(21) Appl. No.: 09/832,108

(22) Filed: Apr. 11, 2001

(65) Prior Publication Data

US 2001/0029130 A1 Oct. 11, 2001

(30) Foreign Application Priority Data

Apr. 11, 2000 (DE) .......................................... 100 18 020

(51) Int. Cl.[7] ............................................... H01R 12/00
(52) U.S. Cl. ........................ 439/67; 439/276; 439/736; 439/936
(58) Field of Search ............................. 439/63, 67, 492, 439/493, 496, 499, 932, 936, 722, 736, 276

(56) References Cited

U.S. PATENT DOCUMENTS

| | | | | | |
|---|---|---|---|---|---|
| 3,851,294 | A | * | 11/1974 | Palazzetti et al. | 439/272 |
| 4,072,378 | A | * | 2/1978 | Lochbrunner et al. | 439/370 |
| 4,895,138 | A | * | 1/1990 | Yabe | 600/110 |
| 5,039,942 | A | | 8/1991 | Buchschmid et al. | |
| 5,382,829 | A | * | 1/1995 | Inoue | 174/254 |
| 5,409,384 | A | * | 4/1995 | Green et al. | 439/67 |
| 5,652,608 | A | * | 7/1997 | Watanabe et al. | 347/50 |
| 5,735,697 | A | * | 4/1998 | Muzslay | 439/83 |
| 5,830,010 | A | * | 11/1998 | Miskin et al. | 439/578 |
| 5,833,481 | A | * | 11/1998 | Inoue | 439/263 |
| 6,193,564 | B1 | * | 2/2001 | Loibl et al. | 439/736 |
| 6,445,350 | B2 | * | 9/2002 | Takenobu | 343/713 |

FOREIGN PATENT DOCUMENTS

| DE | 37 06 168 A1 | 2/1987 |
|---|---|---|
| DE | 44 37 664 A1 | 10/1994 |

* cited by examiner

*Primary Examiner*—Tho D. Ta
*Assistant Examiner*—James R. Harvey
(74) *Attorney, Agent, or Firm*—Miles & Stockbridge P.C.; Edward J. Kondracki; John C. Kerins

(57) ABSTRACT

The invention provides an electrical connection arrangement comprising an electrical conductor track element having at least one connection portion electrically connected to a connection zone of an electrical component, wherein a wall is provided in a vicinity of said connection portion and said connection zone, such that a basin is formed and a molding mass is distributed in said basin. Thereby, the connection portion and the connection zone are protected from external influences such as humidity and temperature.

10 Claims, 3 Drawing Sheets

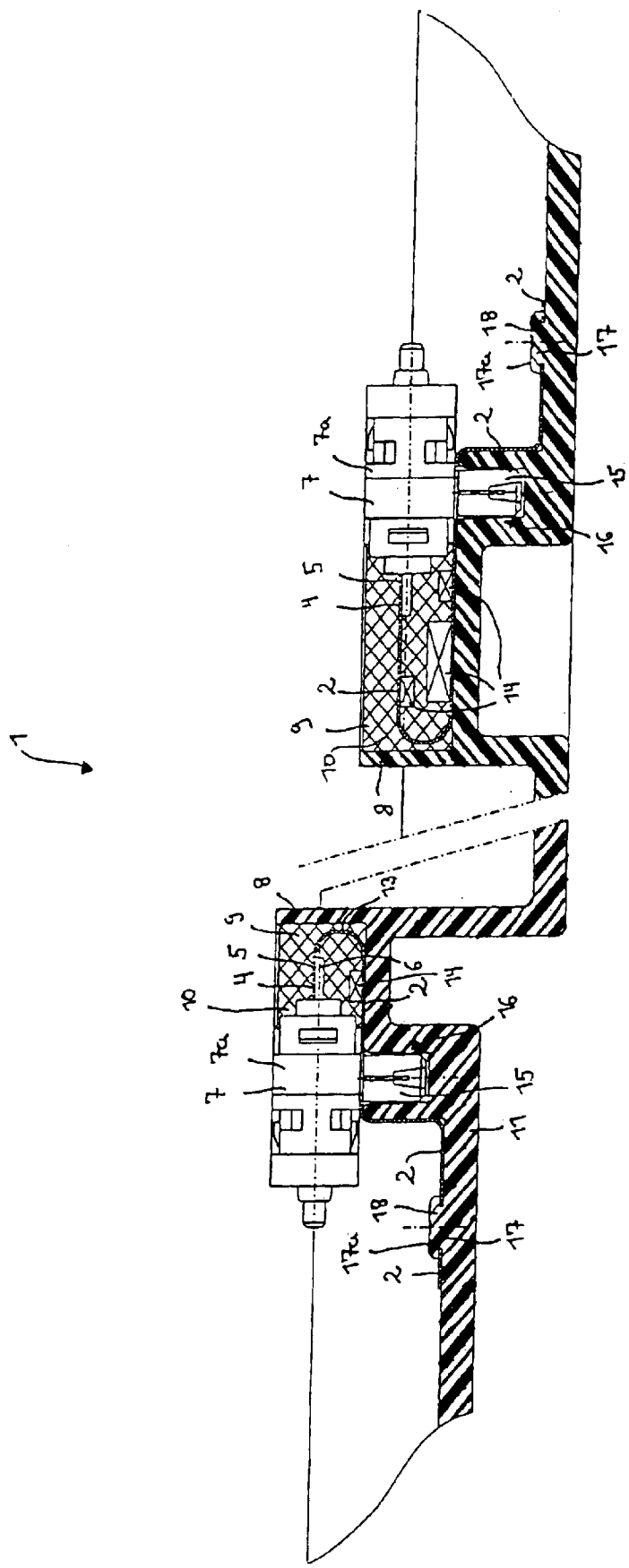

ELECTRICAL CONNECTION ARRANGEMENT AND METHOD FOR THE MANUFACTURE THEREOF

FIELD OF THE INVENTION

The invention concerns an electrical connection arrangement, suitable, for example, for use in closing devices for automotive vehicles. The invention further concerns a method for manufacturing such an electrical connection arrangement.

BACKGROUND OF THE INVENTION

Nowadays, electrical circuit connections are found in many electrical devices. Depending on the device for which they are provided, these electrical circuit connections have to fulfill different requirements as for their functional reliability and operational stability. The requirements concerning functional reliability and operational stability of connection arrangements for fixedly installed and indoor operated devices are lower than for mobile and outdoor operated devices. Among other things, those requirements are particularly high for devices which are installed in automotive vehicles, as for example closing devices for car doors, trunks, engine hoods or the like. Here, the connection arrangements are frequently heavily stressed by occasionally occurring extreme outside temperatures and air humidity, by strong variations of those quantities, by soil particles in the ambient air as well as by mechanical vibrations.

It is an object of the invention to provide an electrical connection arrangement which is to a high degree functionally reliable and operationally stable even if it is heavily stressed. Furthermore, it is an object of the invention to develop a method for manufacturing such an electrical connection arrangement.

SUMMARY OF THE INVENTION

According to the invention, the object is achieved by a connection arrangement comprising an electrical conductor track element having at least one connection portion electrically connected to a connection zone of an electrical component, wherein a wall is arranged in the vicinity of the connection portion and the connection zone such that a basin is formed in which a molding mass is distributed. The connection portion and the connection zone which are electrically connected to each other by a soldered joint or a weld joint are protected from their surroundings by the molding mass which covers the connection portion and the connection zone. Soil particles in the ambient air are kept away from the soldered or weld joint, in case of a soldered joint in particular from its especially sensitive soldering tin. Furthermore, the molding mass reduces the influence of extreme outside temperatures and air humidity as well as the influence of large variations of those quantities so that the connection portion and the connection zone are stressed less. The application of the molding mass, that is a mass which is applied in pasty form and cures subsequently, shows the advantage that an optimal adaptation to the spatial form of the connection portion and the connection zone is enabled, resulting in an optimal coverage and thus protection.

One further advantage is apparent in the case of the application to the connection portion and the connection zone of a liquid molding mass, which, as a liquid, has the property that it flows. As a result, it has a tendency to disperse beyond the connection portion and the connection zone. The wall of the basin limits this dispersion. Thus, a deterioration of other components of the track element is avoided.

In a preferred embodiment, the track element within the basin is provided with at least one additional electrical component. The additional electrical component may be completely covered by the molding mass. Therefore, it is particularly well protected from external influences. Consequently, the arrangement of the additional component is especially suitable for highly sensitive additional electrical components.

In a further embodiment, the track element is flexible. Because of this—plastic or elastic—flexibility, it is especially simple to adapt the track element to the spatial form of the device.

Furthermore, it is preferred that the track element has a bent portion within the basin. Thus, the area of the track element which is within the basin and which is covered by the molding mass can be enlarged in a simple way, which enables the arrangement of more than one additional electrical component within the basin.

It is provided in a further preferred embodiment of the invention that the connection arrangement is arranged within a housing. The housing provides a simple additional means for protecting the connection arrangement from external influences.

In yet a further preferred embodiment of the invention, it is provided that the wall forms part of the housing. Advantageously, no separate means for keeping the wall in its spatial position have to be provided. In this embodiment, the basin forms part of the housing.

It is provided in a further embodiment of the invention that the housing has at least one holding protrusion, the holding protrusion extending through a holding opening of the track element. This embodiment shows two advantages. On the one hand, assembling the track element within the housing becomes easier. The track element must only be arranged within the housing such that the holding protrusion extends through the holding opening. On the other hand, the track element of this embodiment is securely kept in its position when the device works, in particular if vibrations are present. It can be provided that the holding protrusion has a head manufactured by applying a stamp to the preheated or not preheated holding protrusion, the head being larger than the holding opening, whereby the track element is securely kept within the housing.

Furthermore, it is preferred if the housing has at least one receiving portion which receives a holding zone of the component. This embodiment enables that the component is securely kept in its position.

It is preferred if the track element comprises a plurality of layers and/or at least one layer of the track element includes the tracks and/or at least one of the layers is an isolating layer. In this embodiment, the track element is a multi-layer track element. In case the isolating layer is in direct contact with the molding mass, the layer of the track element including the tracks is especially protected. Thus, a deterioration of the tracks, especially when distributing the molding mass in the basin, can easily be avoided.

Furthermore, there is provided a method for manufacturing an electrical connection arrangement comprising the steps of forming an electrical connection between a track element and an electrical component; arranging the electrical connection in a basin and at least partially filling said basin with a molding mass.

Further embodiments of the invention along with their advantages may be obtained from the accompanying drawings.

BRIEF DESCRIPTION OF THE DRAWINGS

The invention will now be explained, by way of example only, with reference to the accompanying drawings in which:

FIG. 3 shows two further sections along lines B—B and C—C of the connection arrangement of FIG. 1.

DETAILED DESCRIPTION OF THE PRESENT INVENTION

Figure 1:
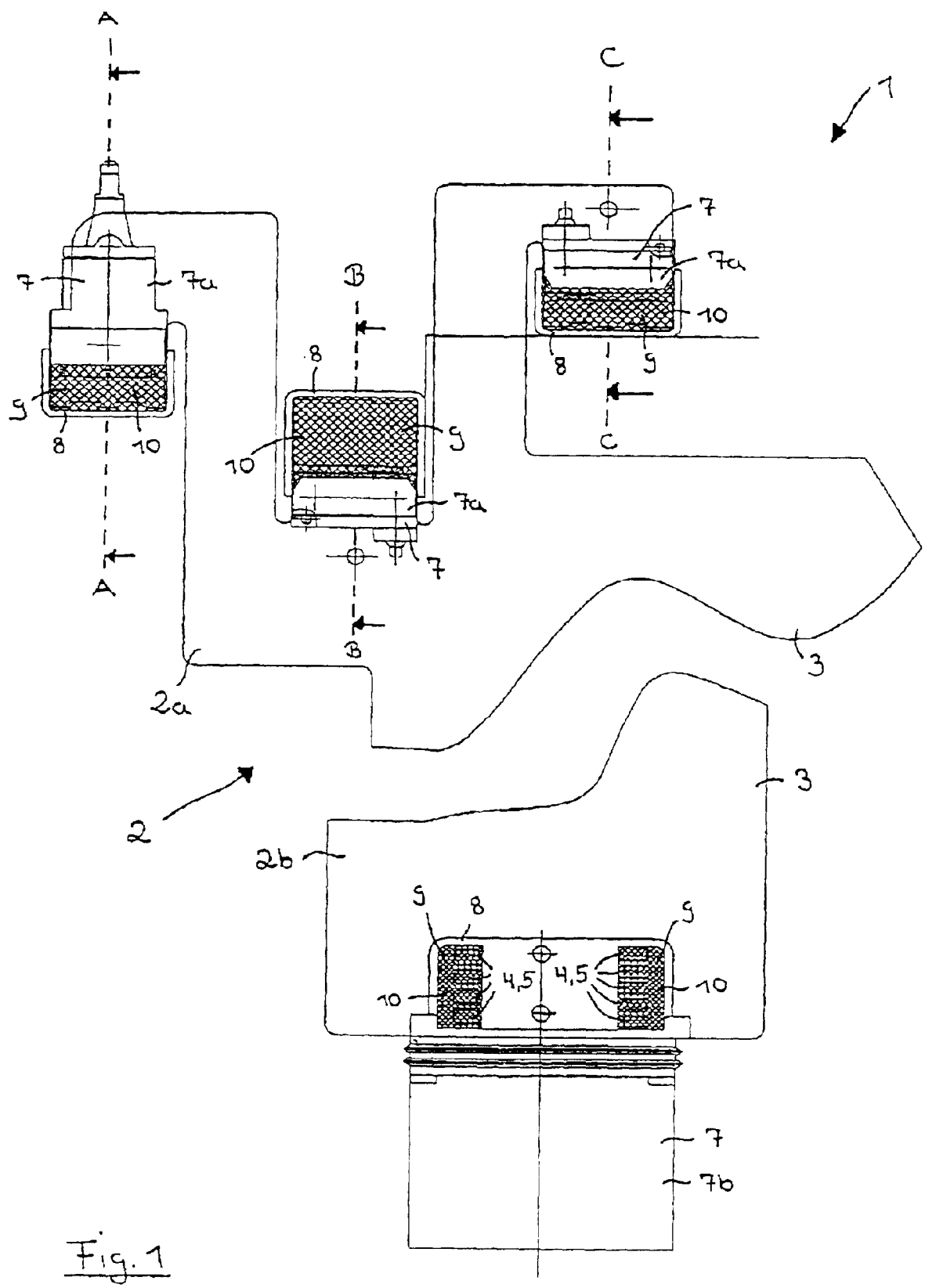
FIG. 1 shows a schematic top view of an electrical connection arrangement according to the invention.

FIG. 1 shows an electrical connection arrangement 1, as it is for example applied in closing devices for doors, trunks, engine hoods or the like of automotive vehicles.

The connection arrangement 1 comprises an electrical track element 2. In FIG. 1, two portions 2a and 2b of the track element 2 are shown. The track element 2 is a flexible, foil-like track element 2 including several layers 3. The layers 3 of the track element 2 are isolating layers and electrical track including layers, for example copper foil tracks sandwiched between polyamide layers. The isolating layer includes openings so that the tracks of the track including layer can be accessed from outside. Within the openings, the tracks form connection portions 5 formed as soldering pads 4. At the connection portions 5, an electrical connection with connection zones 6 (not shown in FIG. 1) of an electrical component 7 is formed.

As shown, the electrical components 7 connected to the track element 2 are a switch 7a and an interface connector 7b. Other electrical components may be connected and the illustration of a switch and an interface connector is not intended to limit the invention to these components. Other components which may be connected include sensor elements, motors, display elements and the like. The connection between the connection portions 5 of the track element 2 and the connection zones 6 of the electrical components 7 is in the form of a soldered joint.

The connection arrangement 1 is arranged within a housing 11 of which only walls 8 of the housing 11 are visible in FIG. 1. In the vicinity of the connection portions 5 and the connection zones 6, the walls 8 are arranged such that they form along with the electrical components 7 basins 9, each basin 9 being open on one side. The basins 9 contain a molding mass 10, which, in the example shown, fills the basin 9 completely. Within the basins 9, the molding mass 10 covers the connection portions 5, the connection zones 6 as well as parts of the isolating layer of the track element 2. In alternative embodiments, the basin may only be partially filled with molding mass such that the connection portions are covered thereby.

Figure 2:
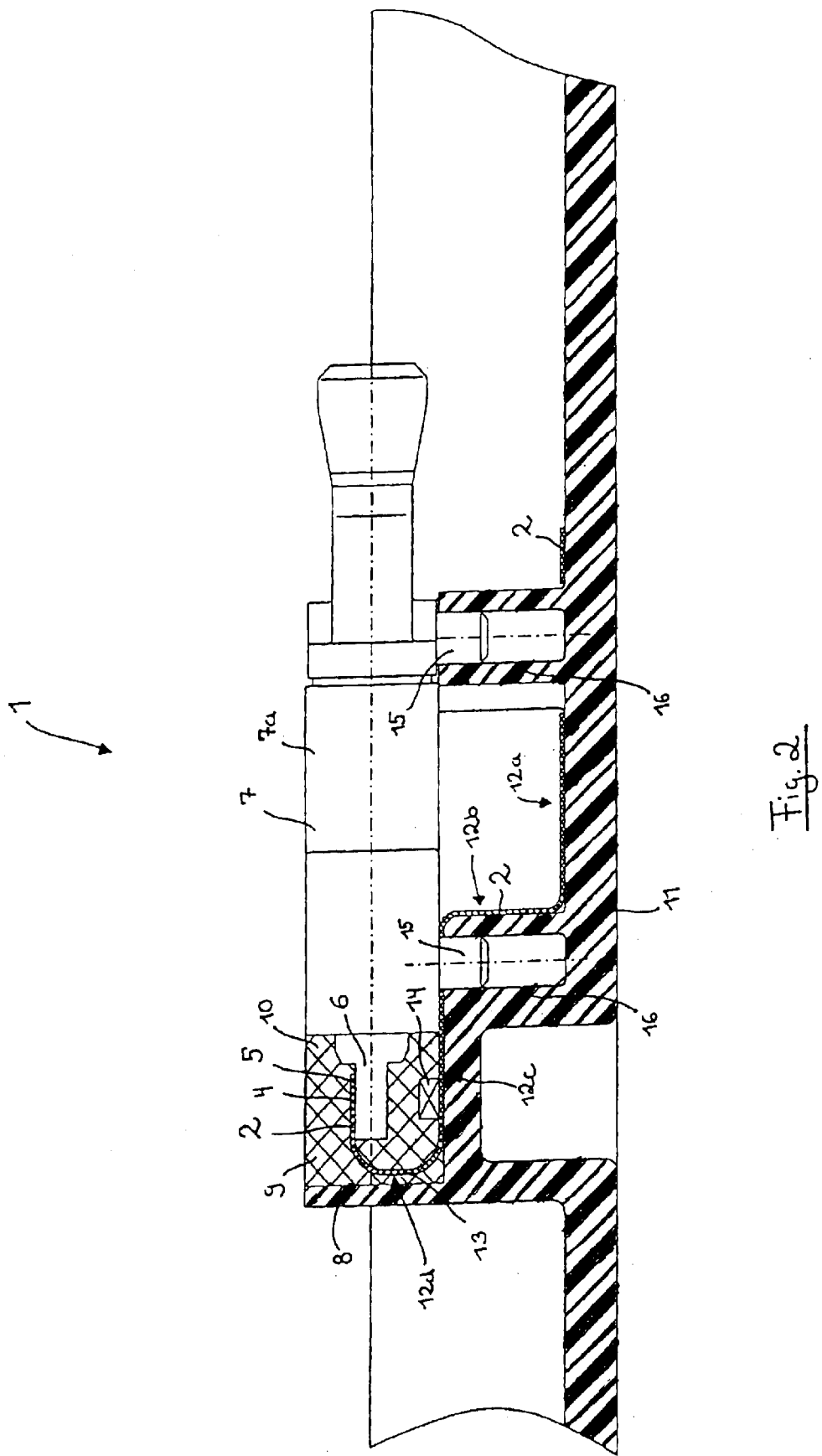
FIG. 2 shows a section along line A—A of the connection arrangement of FIG. 1.

FIG. 2 shows a section through the connection arrangement 1, the section being along line A—A. FIG. 2 also shows the plastic housing 11, a part of which forms the wall 8 of the basin 9.

Furthermore, FIG. 2 shows that the track element 2 is not planar. In a first zone 12a, the track element 2 extends along the surface of the housing 11 and in a second zone 12b, the track element 2 extends along the outer surface of a holding protrusion 17, the holding protrusion 17 being formed in the housing 11. In a third zone 12c, the track element 2 extends—approximately parallel to its direction of extension in the zone 12a—through the lower portion of the basin 9. Next to the zone 12c, the track element 2 has a bent portion 13 in a zone 12d. The track element 2 ends in the connection portion 5. As a consequence of its flexibility, the track element 2 can adapt to any spatial form determined by the housing 11 or the electrical component 7.

In the third zone 12c, the track element 2 is provided with an additional electrical component 14. The additional electrical component 14 is a surface mounted resistor. Other components, in particular wired components, can likewise be applied as additional electrical component 14.

FIG. 2 shows that the basin 9 is formed by the wall 8, the housing 11 and the component 7. The connection zone 6 of the electrical component 7 extends away from the component 7 into the interior of the basin 9 where it is connected to the connection portion 5 of the track element 2 by means of a soldering joint.

The interior of the basin 9 is completely filled with the molding mass 10. As a consequence, the additional electrical component 14, the bent portion 13 of the track element 2, the connection portion 5 of the track element 2 and the connection zone 6 of the component 7 are completely filled or encapsulated, respectively, by the molding mass 10. Epoxy resin is used as molding mass 10, wherein the epoxy resin is brought into the basin 9 in gel-like or pasty form and cures within the basin 9 subsequently.

FIG. 2 shows in which way the component 7 is fixed within the housing 11. For this purpose, it comprises two holding zones 14 extending away from the body of the component 7 and engaging in receiving portions 16, the receiving portions 16 forming part of the housing 11. This arrangement ensures that the component 7 is securely held by the housing 11.

FIG. 3 comprises two subfigures; the left subfigure shows a section along a line B—B in FIG. 1 and the right subfigure shows a section along a line C—C in FIG. 1. The connection arrangement 1 comprises several holding protrusions 17, the holding protrusions being formed in the housing 11. The holding protrusions extend through holding openings 18 of the track element 2 and end in heads 17a—the heads being generated by applying a stamp to the preheated or not preheated holding protrusions and the heads being larger than the holding openings 18 so that the track element 2 is securely kept by the housing 11. On the one hand, the assembly comprising the holding protrusions 17 and the holding openings 18 facilitates the mounting of the track element 2 in the housing 11; on the other hand, it ensures that the track element 2 is securely kept in the housing 11.

The right subfigure of FIG. 3 shows that the track element 2 within the basin 9 can additionally be provided with several additional components 14, provided that the dimensions of the basin 9 are chosen suitably.

Whereas many alterations and modifications of the present invention will be apparent to a person of ordinary skill in the art after having read the foregoing description, it is to be understood that the particular embodiments shown and described by way of illustration are in no way intended to be considered limiting.

I claim:

1. An electrical connection arrangement comprising a flexible multi-layer foil-like electrical conductor track element having at least one connection portion electrically connected to a connection zone of an electrical component, wherein walls of a housing of the electrical connection arrangement are provided in the vicinity of said connection portion and said connection zone, said walls being arranged such that they form, along with the electrical component, a basin, said basin being open on one side only, and an originally flowable molding mass is distributed in said basin such that said connection portion of the electrical conductor track element and said connection zone of the electrical component are completely covered by the molding mass without completely covering the entire track element.

2. The electrical connection arrangement of claim 1, wherein said track element is provided with at least one additional electrical component within said basin.

3. The electrical connection arrangement of claim 1, wherein said track element has a bent portion within said basin.

4. The electrical connection arrangement of claim 1 wherein said connection arrangement is arranged within the housing.

5. The electrical connection arrangement according to claim 1 wherein said walls forms part of the housing.

6. The electrical connection arrangement of claim 1 wherein said connection arrangement is arranged within the housing having at least one retaining protrusion extending through a retainer opening of said track element.

7. The electrical connection arrangement of claim 1 wherein said connection arrangement is arranged within the housing having at least one receiving portion for receiving a part of said electrical component.

8. The electrical connection arrangement of claim 1 wherein at least one layer of said track element comprises electrically conductive tracks.

9. The electrical connection arrangement of claim 1 wherein at least one layer is an electrically isolating layer.

10. The electrical connection arrangement of claim 1 wherein said electrical component has a body that forms a part of said basin.

* * * * *